United States Patent [19]

Matsuoka

[11] 4,419,897

[45] Dec. 13, 1983

[54] APPARATUS FOR HARMONIC OSCILLATION ANALYSIS

[75] Inventor: Katsutoshi Matsuoka, Chigasaki, Japan

[73] Assignee: Nippon Seiko Kabushiki Kaisha, Tokyo, Japan

[21] Appl. No.: 147,050

[22] Filed: May 6, 1980

[51] Int. Cl.³ .............................................. G01H 1/00
[52] U.S. Cl. ..................................................... 73/660
[58] Field of Search ................. 73/593, 658, 659, 660, 73/661

[56] References Cited

U.S. PATENT DOCUMENTS

| | | | |
|---|---|---|---|
| 3,971,249 | 7/1976 | Bachofer | 73/593 |
| 4,196,629 | 4/1980 | Philips | 73/593 |
| 4,213,346 | 7/1980 | Polovnikov et al. | 73/660 |

*Primary Examiner*—Stephen A. Kreitman
*Attorney, Agent, or Firm*—Wyatt, Gerber, Shoup, Scobey & Badie

[57] ABSTRACT

Apparatus for harmonic oscillation analysis includes a detector for taking up, as electric oscillation, mechanical vibration generated during the operation of a rotary machine system, a comb filter for extracting from the detector's output signal having a composite periodic oscillation wave form only fundamental wave component of a determined fundamental frequency fo and its harmonic wave component, and a clock pulse generator for generating clock pulses to drive the comb filter by the clock pulse having the fundamental frequency fo and a discriminator for evaluating abnormality of the rotary machine system depending upon the particular signal components extracted through the comb filter.

5 Claims, 5 Drawing Figures

APPARATUS FOR HARMONIC OSCILLATION ANALYSIS

BACKGROUND OF THE INVENTION

1. Field of the Invention

The present invention relates to apparatus for carrying out harmonic oscillation analysis and more particularly relates to such apparatus for determining the cause for abnormal vibration occurring in a machine system whose operation is accompanied by vibration, by extracting the harmonic oscillation.

2. Description of the Prior Art

It is well-known that in machines such as rotary machine systems there are often generated during its rotation various vibrations in axial, radial and rotational directions which bring the rotary system into an undesirable abnormal state. To detect such abnormal vibration, hitherto, many abnormality watching and/or forecasting methods have been employed. According to one of the known methods, acceleration, velocity and displacement of vibration are detected by using a detector to electrically obtain the wave form of the vibration. Based on the obtained wave form, discrimination of frequency and/or amplitude of the occurring vibration is conducted. According to another known method, signal level in a specific frequency band is detected.

However, these abnormal vibration watching and forecasting methods according to the prior art are generally unsuitable for analyzing the cause for abnormality precisely and in detail. Since according to the prior art methods oscillation wave forms in relatively broad frequency band are processed, it is difficult to determine the details of the cause for abnormal vibration occurring in a rotary machine system.

SUMMARY OF THE INVENTION

The present invention is based on the finding that a particular cause for abnormality can be characterized by the specific reason periodic oscillation inherent in the unique cause.

Abnormal vibration generated in a rotary machine system is primarily attributable to defect and failure of parts such as deformation and damage of the bearing part and transmission part. When a rotational speed is constant, such abnormal vibration takes a form of periodic vibration having a certain specific fundamental period which is determined by the geometrical structure of the part in question such as bearing or transmission. In some cases, such abnormal vibration may be a vibration having a single fundamental period and in some cases it may be a composite vibration having two or more different fundamental periods.

As an example, reference may be made to a ball-and-roller bearing. In a ball-and-roller bearing there is generated a composite periodic vibration during its operation irrespective as to whether any abnormal matter is present or not. In this case, the composite periodic vibration has several different fundamental frequencies which are uniquely determined by the sizes of outer and inner races and ball, the number of balls used and the rotational frequency. Of course, when there is any failure in the parts of bearing, a vibration of larger amplitude corresponding to the state of the failure will be generated which has also a specific fundamental inherent period inherent thereto. Therefore, by extracting only such specific, fundamental vibration period and examining the extracted component it is possible to discriminate the failure in the bearing part from that in the transmission part. For the former it is further possible to locate the place where the failure exists, that is, in outer race or in the inner race or in balls. Moreover, site of the problem can be ascertained by analyzing the extracted wave form of the vibration. Namely, whether the problem is of deformation or of local damage can be determined. In this manner, for a vibration having a specific frequency component only, it is possible to ascertain the cause of abnormal vibration.

Accordingly, it is an object of the invention to provide an apparatus for harmonic oscillation analysis which make it possible to locate the source of an abnormal vibration by extracting the periodic vibration inherent in the cause from a composite oscillation wave form and evaluating the extracted component.

To attain the object according to the invention there is used a comb filter for extracting the particular periodic vibration inherent in a particular cause. This comb filter is an assembly of narrow band-pass filters formed as to have such overall frequency characteristics on the frequency axis of which the frequency characteristics of the respective band-pass filters can be allocated at equal intervals. Also, the comb filter is a digital filter in which the center frequency interval of the respective band-pass filters can be set at will by changing the frequency of clock pulse. Therefore, it is possible to extract only a particular frequency component from a composite periodic oscillation wave form with respect to a particular fundamental period To, all over the frequency range of from 1/To to n/To (wherein n corresponds to the number of steps n of narrow band-pass filters), namely, for every frequency of 1/To, 2/To, 3/To ... n/To.

Other and further objects, features and advantages of the invention will appear more fully from the following description taken in connection with the accompanying drawings.

DESCRIPTION OF THE PREFERRED EMBODIMENTS

Figure 1:
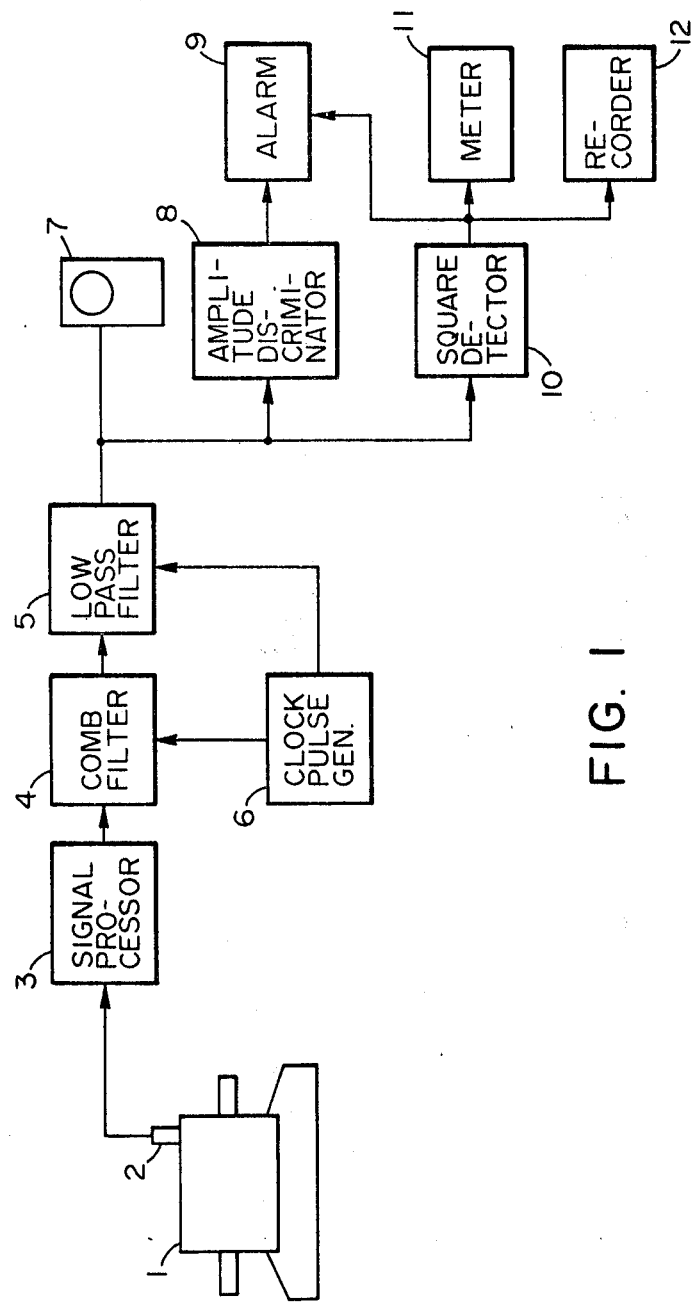
FIG. 1 is a block diagram of apparatus for harmonic oscillation analysis showing an embodiment of the invention.

In FIG. 1, reference numeral 1 designates a rotary machine system and 2 is a detector for converting mechanical vibration into electrical signal.

The electrical signal obtained by the detector is, if necessary, introduced into a signal processor 3 to process the signal in a selected manner such as integration, differentiation, band limitation or level regulation. The output of the processor 3 is introduced into a comb filter 4 composed of a group of narrow band-pass filters. The respective narrow band-pass filters constituting the comb filter are assembled in such manner that there is obtained such overall frequency characteristic on the frequency axis of which the frequency characteristics of the respective filters can be allocated at equal intervals. Thus, it is possible to extract from a composite periodic oscillation wave form only a particular frequency component at a particular fundamental period To (frequency 1/To) and every multiple thereof by a whole number. In other words, a specific frequency can be extracted at every frequency in the order of 1/To, 2/To, 3/To . . . n/To. The periodic wave form thus extracted by the comb filter 4 is then band limited up to a desired harmonic wave by a low-pass filter 5. Designated by 6 is a clock pulse generator which generates a clock pulse having a determined repetitive frequency by setting the fundamental period To or fundamental frequency fo (=1/To) of the periodic vibration to be extracted. The clock pulse drives the comb filter 4 and low-pass filter 5 to make them carry out the extraction and band limitation of the desired periodic wave form. At this time, the repetitive frequency of the clock pulse determines the center frequency interval of the narrow band-pass filter group of the comb filter.

The output from the low-pass filter 5 can be used for analysis in various ways. For example, by observing the wave form using an oscilloscope 7 the operator can determine the cause for the vibration having a certain particular fundamental frequency, that is, whether it is caused by a local damage or by shaping error or deformation. In the former case, the vibration is in the form of shock wave whereas the vibration in the latter case is relatively gentle. Also, by discriminating the amplitudes using amplitude discriminator 8, there can be the occurrence of abnormality or a forecast therefor can be segregated through an alarm 9. In this case, the alarm 9 is driven when the amplitude exceeds a preset value. As another form of use of the output signal for analysis, a square detector 10 may be used. Assuming that the fundamental frequency of the extracted frequency is fo, upper limit order is M and the amplitude at the order n is Cn, then the periodic wave can be represented by:

$$\sum_{n=1}^{M} Cn \cos(2\pi n f_0 t + \theta n)$$

Therefore, by the square detector 10 there is obtained a power of $$\sum_{n=1}^{M} Cn^2.$$

Figure 2:
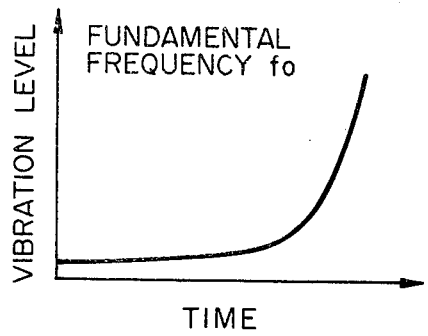
FIG. 2 is a graph obtained when an abnormality in the outer race of a ball-and-roller bearing selected as an object to be measured was measured and recorded with time.
Figure 3:
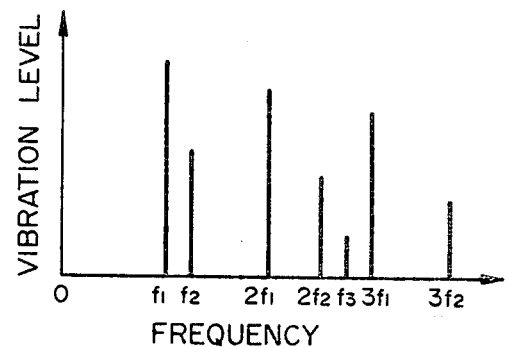
FIG. 3 is a fragmentary characteristic curve obtained from the composite vibration level produced when clock frequency setting was automatically swept while recording the level on the frequency axis.

The operator can read the value of the power then obtained on a power level meter 11. Also, change of the particular periodic vibration level with time can be recorded with a recorder 12. FIG. 2 shows an example of such vibration level curves recorded by the recorder 12 when the outer race of a ball-and-roller bearing was abnormal. FIG. 3 shows an example of recorded graphs regarding the level of a composite periodic vibration. The recording was carried out by automatically sweeping the frequency setting of the clock pulse generator 6.

As will be readily understood from the foregoing, the apparatus for harmonic oscillation analysis according to the invention permits the analysis of an occurring oscillation phenomenon more precisely and in detail. Therefore, a further detailed analysis of vibration which is difficult to do according to the prior art can be made possible with the apparatus according to the invention. Furthermore, it is made easy to perform watching and forecasting of abnormal vibration.

Figure 4:
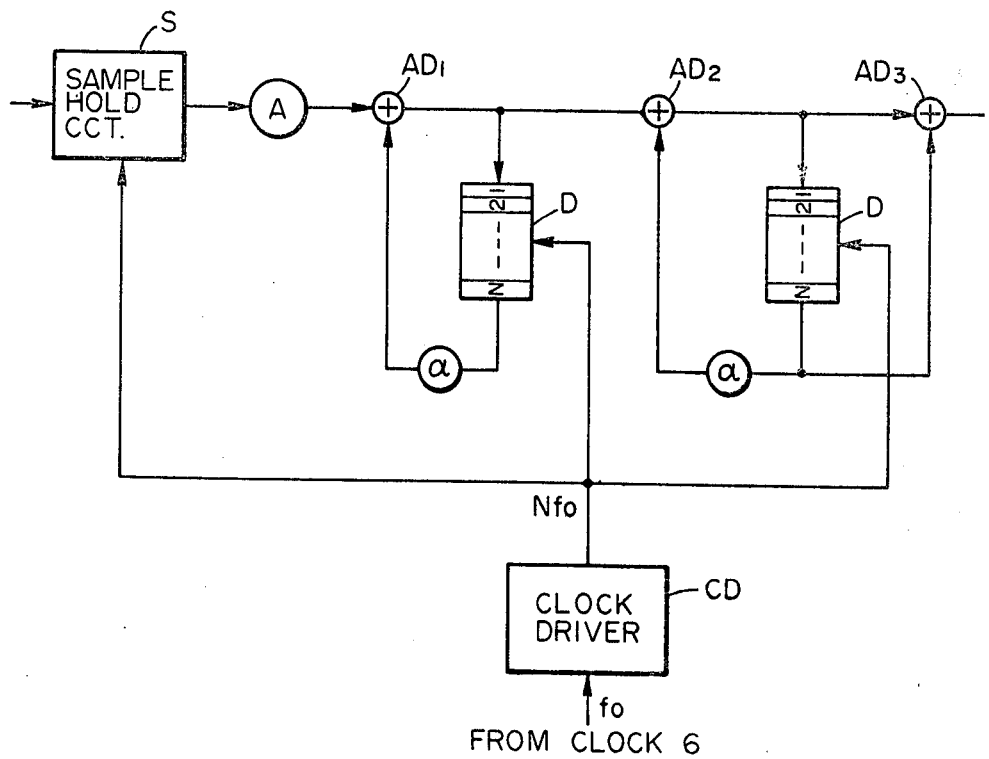
FIG. 4 is a block diagram of the comb filter used in the embodiment shown in FIG. 1 showing the arrangement of the filter in detail.

FIG. 4 shows an example of arrangement of the comb filter 4 which constitutes the essential part of the invention.

As already mentioned above, the comb filter 4 is an assembly composed of narrow band-pass filters with the center frequencies being allocated at equal intervals. The comb filter 4 is a digital filter in which the center frequency interval can be set at will by changing the repetitive frequency of pulse generated by the clock pulse generator 6. For the embodiment illustrated, the transfer function of digital filter which serves as the basis of the comb filter, when expressed in Z transformation, is:

$$H(Z) = A(1 + Z^{-N})/(1 - \alpha Z^{-N})^2$$

wherein,

A and $\alpha$ are constants for determining filter characteristics, and $Z^{-N}$ is complex variable for the case where delay circuit D is composed of N stages of delay elements.

Since generally complex variable $Z = e^{j\omega T}$, $Z^{-N}$ is represented by $e^{-jN\omega T}$. Angular frequency $\omega_0 = 2\pi fo$. Here, let $fo = 1/NT$ and T delay time per stage of N stages of delay elements, then the above transfer function also becomes a frequency function of the inherent frequency fo. Therefore, when a delay circuit D composed of N stages of delay elements is driven by driving frequency Nfo as shown in FIG. 4, a comb filter which satisfies the above transfer function can be realized.

The comb filter shown in FIG. 4 includes a sample hold circuit s which carries out sampling of analog signals from the before-connected signal processor 3 by driving frequency Nfo from a clock driver CD. The output from the sample hold circuit s is applied to a constant circuit A for determining the characteristic of the comb filter so that 1:1 transfer characteristic is assured. The output of constant circuit A is applied to one input terminal of adder AD1 the other input terminal of which receives a signal, that is, the output of delay circuit D multiplied by $\alpha$. The two inputs are added together in the adder AD1. Each of the adders AD1, AD2 and AD3 shown in FIG. 4 may be formed by using ordinary operational amplifier. In this embodiment, the delay circuit D is composed of a Bucket Brigade device, (hereinafter referred to as BBD) with N=256. This BBD is driven by driving pulse having frequency Nfo from the clock driver CD. The clock driver CD receives from the clock 6 (FIG. 1) a clock pulse of specific frequency fo and generates a driving pulse having the frequency of the received frequency multiplied by N, that is, the frequency of Nfo. As already described, the specific frequency fo is a frequency of periodic vibration inherent to a certain particular cause for abnormality relating to an object to be measured. Therefore, the specific frequency is variable for different objects to be measured. In the embodiment illustrated, since BBD is composed of N=256 stages of delay elements, it is evident that the frequency of the driving pulse issued from the clock driver CD is 256 fo. To drive BBD there may be used various methods. One example is the method using pulses of two phases shifted by 180° from each other. Since BBD is well-known in th art, it need not be further described.

As will be readily understood from the foregoing and from the arrangement shown in FIG. 4, it is make possible to extract the signal component relating only to the frequency set by the clock 6, that is, the frequency of periodic vibration inherent to a certain cause for the matter of an object to be measured from the output coming from the comb filter 4, that is, the output coming from the adder AD3 shown in FIG. 4. This permits analysis of the cause for an occurring abnormal vibration in detail.

While the comb filter in FIG. 4 embodiment has been shown to include a sample hold circuit s, it should be understood that the sample hold circuit is not always necessary. Also, it should be understood that the above described transfer function is only one example and the number of orders N(256) as well as zero point may be suitably selected for the aimed purpose.

As previously described, the low-pass filter 5 is used for band limiting the periodic wave form extracted by the comb filter 4 to the desired harmonic wave. Therefore, in principle, this low-pass filter is not always necessary for the apparatus of the invention. However, to carry out a highly precise measurement with the apparatus of the invention, it is preferred to use such low-pass filter. In this sense, a brief description will be made hereinafter of the low-pass filter 5.

The low-pass filter 5 is formed by using multistage delay elements (for example CCD) with center taps in such manner that each tap output is multiplied by a weight corresponding to the impulse response of the low-pass filter having a steep breaking characteristic and then all the outputs are added together. This arrangement of low-pass filter is well-known in the art. Since the impulse response is given symmetrically before and behind relative to the center tap, it has a linear phase characteristic which assures that the low-pass filter never gives the signal component within the pass band any distortion of wave form. Thus, it is allowed to extract a desired periodic oscillation wave form without distortion. Therefore, by observing the wave form thus extracted in the manner described above the operator can precisely locate the cause for abnormal vibration. The pulse for driving the low-pass filter may be such pulse having the same frequency as that of pulse used for driving the comb filter. In this case, the order of band limitation is determined by the frequency. However, the order of band limitation may be determined at will by using a low-pass filter driving pulse having a frequency different from that of the comb filter driving pulse. For example, assuming that when the low-pass filter 5 is driven by a driving pulse of the same frequency as that of the comb filter driving pulse, that is, the frequency Nfo, the maximum order of band of the low-pass filter is M order, then the band pass order can be limited up to M/2 order by using, as low-pass filter driving pulse, a pulse the frequency of which is ½ of above frequency Nfo.

The apparatus according to the present invention can be used for analyzing any objects which present a composite harmonic oscillation. However, when the object is, for example, a rotary machine system, the rotational frequency of the system will usually vary with change in rotation load and/or operational condition. Under such conditions, the fundamental frequency of the harmonic oscillation is also subjected to change in proportion to the rotational frequency. This produces the possibility that some high order harmonic wave may be deviated from the center frequency of the narrow band-pass filter of the comb filter and therefore the harmonic wave may be decayed to a great extent. In such case, precise evaluation of the occurring vibration becomes difficult to do.

Figure 5:
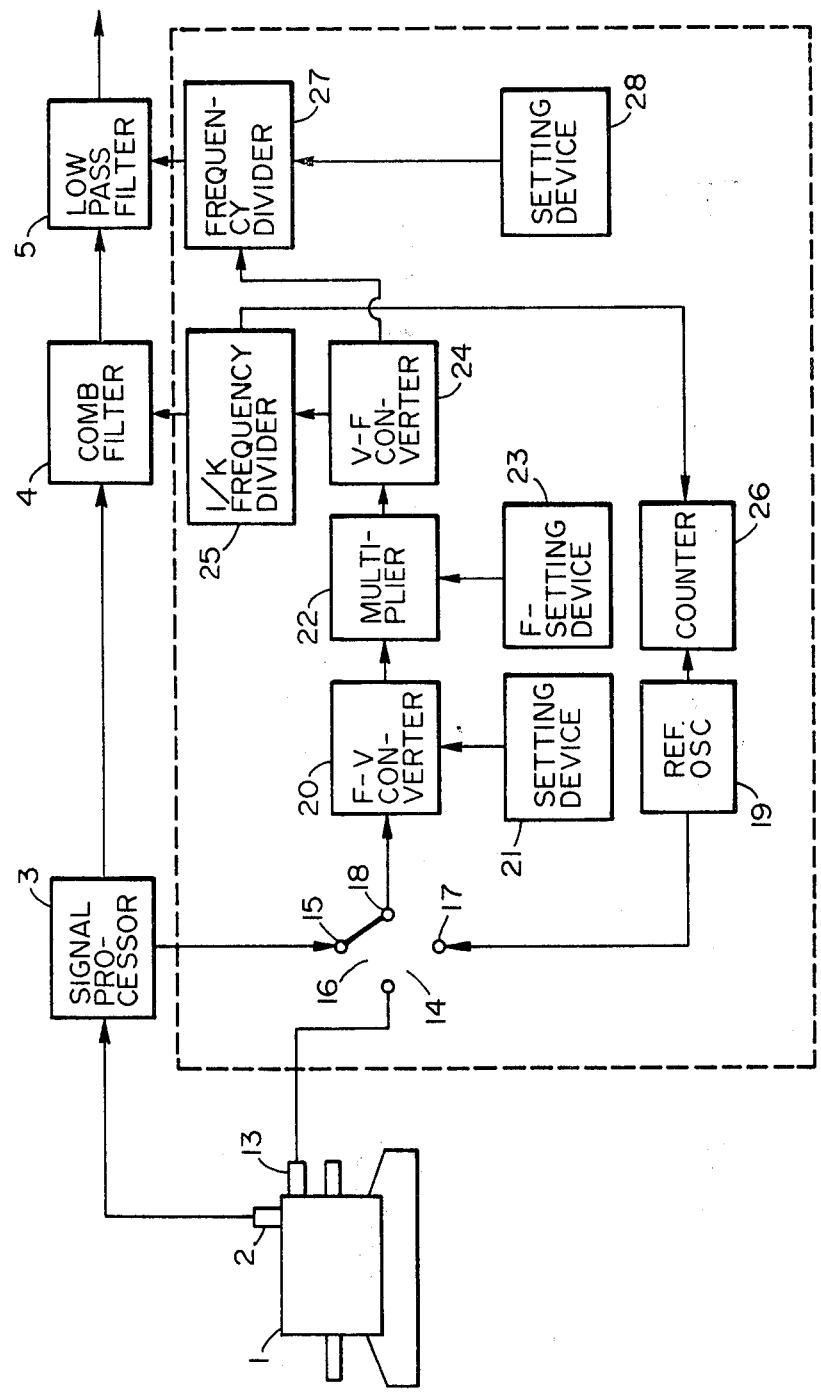
FIG. 5 is a block diagram similar to FIG. 1 showing a second embodiment of the invention.

According to the invention the above-mentioned difficulty can be eliminated by using a second embodiment as illustrated in FIG. 5.

In FIG. 5, reference numerals 1-6 designates the same members as in the first embodiment shown in FIG. 1. Designated by 13 is a detector for detecting the rotational frequency of a rotary machine. 14 is a synchronous mode change-over switch whose terminals are designated by 15-17. 18 is its common terminal. When the vibration wave form obtained from the vibration detector 2 includes a signal informing of the rotational frequency of the rotary machine, the wave form is introduced into a F-V converter 20 through the signal processor 3 and change-over switch terminal 15. On the contrary, when the wave form does not contain such a signal of the rotational frequency, the change-over switch 14 is switched over to the terminal 16 so that a signal of rotational frequency (for example, one pulse per revolution) coming from the detector 13 can be introduced into the F-V converter 20 through the common terminal 18. If the rotational frequency of the rotary machine system 1 is sufficiently stable and no synchronizing is required, then the change-over switch 14 can be changed over to the terminal 17. By doing so, a stable frequency signal given by a reference oscillator 19 is introduced into the F-V converter 20 through the common terminal 18. Designated by 21 is a setting device for setting a certain operational condition (for example 1800 rpm) to fix the output of the F-V converter 20 at a certain constant DC voltage so long as the rotary machine is in a stable and normal state of operation. If it becomes unstable, the output of the F-V converter 20, therefore, has a signal voltage higher or lower than the above DC voltage in proportion to the change of rotational frequency. This signal from F-V converter 20 is multiplied by a DC voltage from a frequency setting device 23 in a multiplier 22 and the product, that is, a variable DC voltage is introduced into a V-F converter 24.

In this manner, when the operation is stable or when the change-over switch is set to the terminal 17, the above-mentioned constant DC voltage appears at the output of F-V converter 20. At the output of the multiplier 22 there is obtained a certain constant DC voltage determined by the frequency then set and the constant DC voltage is introduced into the F-V converter 24.

Let the change in rotational frequency be d% and the above mentioned constant voltage Vo, then the output of F-V converter 20 becomes (1+d/100) Vo. Let the DC voltage from the frequency setting device 23 be $V_F$, then there is obtained at the output of the multiplier 22 a voltage proportional to (1+d/100) $V_F$ and therefore V-F converter 24 will produce a clock pulse whose frequency is proportional to (1+d/100) $V_F$.

Since V-F converter 24 is so designed as to generate such clock pulse the frequency of which is K times larger than that of the fundamental clock fo of the comb filter 4, the clock pulse is divided by a 1/K frequency divider 25 so as to form the fundamental clock fo. These driving clocks are gated by a reference signal issued from the reference oscillator 19 and counted by a counter 26. The counted clocks are displayed as center frequency intervals of the comb filter 4. Also, the clock pulse from V-F converter 24 is frequency divided by a frequency divider 27 the frequency dividing ratio of which is set by a signal from limited order setting device 28. The divided clock is used as driving clock for low-pass filter 5.

In the manner described above, according to the second embodiment of the invention the comb filter 4 is driven by clock pulse whose frequency is variable in proportion to change of the rotational frequency during the operation. Therefore, deviation of the high order harmonic wave of an oscillation wave form to be analyzed from the center frequency of narrow band-pass filter mentioned above can be eliminated and a constantly stable wave form can be obtained. In addition, periodic wave forms of different limiting orders can be obtained by altering the frequency dividing ratio of the frequency divider 27. Assuming that the frequency dividing ration is 1/R, the fundamental clock for low-pass filter 5 is K/R of the frequency of the fundamental clock for comb filter 4 and the limiting order becomes MK/R. Therefore, the limiting order is changed by changing the dividing ratio 1/R.

As understood from the foregoing, the apparatus for harmonic oscillation analysis in accordance with the invention has remarkable advantages over the prior devices. With the apparatus according to the invention it is possible to extract a harmonic oscillation wave form having a particular period without distortion of wave form for evaluation, from a composite or noise superimposed harmonic oscillation wave form. This makes it easy to locate the cause for difficulties occurring in a machine operating accompanied with oscillation or defective part of the machine and to judge the kind and degree of abnormality in such machine. Therefore, the apparatus according to the invention is useful for diagnosis, watching or monitoring and forecasting of disorders in many kinds of machines.

I claim:

1. Apparatus for harmonic oscillation analysis comprising:

a detector for taking up, as electrical oscillation, such mechanical oscillation generated during the operation of a rotary machine system;

a comb filter for extracting from the detector's output signal having a composite periodic oscillation wave form only a fundamental wave component having a determined fundamental frequency (fo) and high harmonic wave component thereof;

a clock pulse generator for generating clock pulse to drive said comb filter by the clock pulse having the fundamental frequency fo; and discriminating means for evaluating abnormality of said rotary machine system depending upon the particular signal components extracted by said comb filter.

2. Apparatus according to claim 1, wherein said comb filter is composed of multistage delay elements having a delay time To equal to the period To of the clock pulse generated from said clock pulse generator.

3. Apparatus according to claim 1 or 2, wherein said clock pulse generator allows the frequency of the clock pulse generated from said generator to be variably set.

4. Apparatus according to claim 1 or 2, wherein said apparatus further comprises a low-pass filter disposed between said comb filter and discriminating means and formed as a digital filter which is driven by a driving pulse whose frequency is the same as or different from that of the driving pulse for said comb filter and which is formed by using multistage delay elements with center taps providing a delay time given by multiplying the period of said driving pulse by a whole number.

5. Apparatus according to claim 1 or 2 wherein said clock pulse generator generates such clock pulse having a frequency accomodated to the change in frequency of the detected signal when the signal detected by said detector or by a second detector mounted on said rotary machine system for detecting the state of rotation thereof has any change in frequency relative to the set clock frequency.

* * * * *